US006266799B1

(12) United States Patent
Lee et al.

(10) Patent No.: US 6,266,799 B1
(45) Date of Patent: *Jul. 24, 2001

(54) MULTI-PHASE DATA/CLOCK RECOVERY CIRCUITRY AND METHODS FOR IMPLEMENTING SAME

(75) Inventors: Lance K. Lee, Milpitas; Jyn-Bang Shyu, Cupertino; David Y. Wang, San Jose, all of CA (US)

(73) Assignee: Xaqti, Corporation, Camarillo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/967,087

(22) Filed: Nov. 10, 1997

Related U.S. Application Data (60) Provisional application No. 60/060,738, filed on Oct. 2, 1997.

(51) Int. Cl.$^7$ .................................................. G06F 17/50
(52) U.S. Cl. ........................................................ 716/6
(58) Field of Search ........................... 395/551; 710/126; 375/376, 361; 716/6

(56) References Cited

U.S. PATENT DOCUMENTS

| 5,781,765 | * | 7/1998 | Alexander | 395/551 |
| 5,825,825 | * | 10/1998 | Altmann | 375/293 |
| 5,920,600 | * | 7/1999 | Yomaoka | 375/376 |

OTHER PUBLICATIONS

Lee et al., "A 622Mb/s, CMOS Clock Recovery PLL with Time–Interleaved Phase Detector Array", 1996 IEEE International Solid–State Circuits Conference, 198–199, 444.

Yang et al., "A 0.8μm CMOS 2.5Gb/s Oversampled Receiver for Serial Links", 1996 IEEE International Solid–State Circuits Conference, 200–201, 444.

Fiedler et al., "A 1.0625Gbps Transceiver with 2x–Oversampling and Transmit Signal Pre–Emphasis", 1997 IEEE International Solid–State Circuits Conference, 238–239, 464.

Chen et al., "A 1.25Gb/s, 460mW CMOS Transceiver for Serial Data Communication", 1997 IEEE International Solid–State Circuits Conference, 242–243,465.

Vitesse Semiconductor Corporation, Preliminary Data Sheet, "1.25Gbits/sec Gigabit Ethernet Transceiver–VSC7135", Jun. 5, 1997.

Applied Micro Circuits Corporation, Advance Information, "Fibre Channel and Gigabit Ethernet Tranceiver–S2052", Jun. 19, 1997.

Loring Wirbel, "Chip Vendors prep Ethernet lines for NetWorld+Interhop", EE Times, Sep. 22, 1997.

* cited by examiner

*Primary Examiner*—Matthew Smith
*Assistant Examiner*—Thuan Do
(74) *Attorney, Agent, or Firm*—Beyer, Weaver & Thomas, LLP (57) ABSTRACT

Disclosed is a data/clock recovery system for use in a high speed networking transceiver units. The data/clock recovery system includes a four phase sampler circuit that is configured to receive a data input waveform and produce output data. A transition detect circuit that is arranged to receive the output data produced by the four phase sampler circuit. The transition detect circuit is configured to determine whether a clock is leading or lagging the data input waveform. A counter for shifting the clock if the clock is determined by the transition detect circuit to either be leading or lagging the data input waveform, such that the shifting is configured to synchronize the clock and the data input waveform. A decoder that receives control signals from the counter, such that the decoder generates a selection signal. The data/clock recovery system further including a multiplexer for selecting four predetermined clock phases in response to the selection signal generated by the decoder. Preferably, the four predetermined clock phases are continually shifted by the counter if the clock and the data input waveform are not synchronized.

8 Claims, 11 Drawing Sheets

MULTI-PHASE DATA/CLOCK RECOVERY CIRCUITRY AND METHODS FOR IMPLEMENTING SAME

CROSS REFERENCE TO RELATED APPLICATIONS

This application claims the benefit of U.S. Provisional Patent Application having Ser. No. 60/060,738, filed on Oct. 2, 1997, entitled "MULTI-PHASE DATA/CLOCK RECOVERY CIRCUITRY AND METHODS FOR IMPLEMENTING SAME." This application is hereby incorporated by reference.

BACKGROUND OF THE INVENTION

1. Field of the Invention

The present invention relates generally to integrated circuit devices used for processing data through communication networks, and more particularly, to methods and apparatus for implementing data/clock recovery systems in networking circuitry.

2. Description of the Related Art

In view of the recent push to develop faster networking technology, networking companies have been required to design circuitry that is sufficiently fast to process data at increased speeds. As an example, a number of computer network companies have been working on the development of gigabit Ethernet networking products that are in compliance with the IEEE 802.3z standard (1000 Mbps-Gigabit Ethernet). Although there has been significant progress in increasing data transfer rates to gigabit speeds and greater, much of the core circuitry that is currently implemented in Ethernet transceivers is lagging the advancement in other core gigabit Ethernet circuitry.

A core part of a gigabit Ethernet circuit is the physical level circuitry that is used to interface over a physical media to other network devices. As is well known, transceivers that are integrated into the physical level circuitry must have superior speed, processing integrity and integration flexibility with other existing network circuitry. Typically, the transceivers use analog phase locked loop (PLL) circuitry to do the data/clock recovery. The data clock recovery circuit uses a VOC to generate the multiple phase clocks that run at a lower rate than baud rate to over-sample and latch incoming high speed serial data streams. The multiple sampled data is then fed to multiple phase detectors in parallel, and the outputs of the phase detectors drive multiple charge pump circuits. Each of the charge pumps then drive a single analog loop filter. The output of the loop filter then controls a VCO output frequency.

Unfortunately, the conventional analog data/clock recovery circuits are harder to design and difficult to integrate with digital media access controller (MAC) circuitry. In addition, crosstalk between a transmitter's analog PLL and a receiver's analog PLL is known to cause excessive jitter problems when these circuits are integrated with traditional CMOS network circuitry. As a result, the conventional analog PLL solutions introduce performance reducing side effects that make them incompatible with many of today's high speed networking circuit components.

In view of the foregoing, there is a need for a digital data/clock recovery system that is capable of processing data at high speeds.

SUMMARY OF THE INVENTION

Broadly speaking, the present invention fills these needs by providing methods and apparatuses for a multi-phase data/clock recovery system for use in high speed networking circuit applications. It should be appreciated that the present invention can be implemented in numerous ways, including as a process, an apparatus, a system, a device, a method, or a computer readable medium. Several inventive embodiments of the present invention are described below.

In one embodiment, a multi-phase data/clock recovery circuit is disclosed. The circuitry includes a phase sampler circuit that is configured to receive a data input waveform and produce output data. A transition detect circuit that is arranged to receive the output data produced by the phase sampler circuit. The transition detect circuit is configured to determine whether a clock is leading or lagging the data input waveform. The circuit further includes a counter for shifting the clock if the clock is determined by the transition detect circuit to either be leading or lagging the data input waveform, whereby the shifting is configured to synchronize the clock and the data input waveform.

In another embodiment, a data/clock recovery system is disclosed. The data/clock recovery system includes a four phase sampler circuit that is configured to receive a data input waveform and produce output data. A transition detect circuit that is arranged to receive the output data produced by the four phase sampler circuit. The transition detect circuit is configured to determine whether a clock is leading or lagging the data input waveform. A counter for shifting the clock if the clock is determined by the transition detect circuit to either be leading or lagging the data input waveform, such that the shifting is configured to synchronize the clock and the data input waveform. A decoder that receives a control signal from the counter, such that the decoder generates a selection signal. The data/clock recovery system further including a multiplexer for selecting four predetermined clock phases in response to the selection signal generated by the decoder. Preferably, the four predetermined clock phases are continually shifted by the counter if the clock and the data input waveform are not synchronized.

In yet another embodiment, a method for synchronizing a data stream with a clock of a transceiver is disclosed. The method includes receiving a data stream. Selecting a set of clock phases that are configured to sample the received data stream, such that each phase of the set of clock phases have an inter-phase separation. Examining the received data stream after being sampled with the set of clock phases. The method further includes shifting the clock of the transceiver when the examining indicates that the clock is lagging or leading the data stream. Preferably, the examining is performed on two bits of the data stream at one time, thereby reducing the processing load of a high speed data stream.

In still another embodiment, a method for implementing a data/clock recovery system in a network device receiver is disclosed. The network device receiver is configured to receive a serial data stream from a remote network device. The method includes producing a plurality of clock phases for every two bits of the serial data stream. Selecting four clock phases from the plurality of clock phases, such that the four clock phases have a predetermined separation. Analyzing the serial data stream that corresponds to the selected four clock phases to determine whether a new four clock phases should be selected from the plurality of clock phases. Selecting the new four clock phases when the analyzing indicates that the selected four clock phases and the serial data stream are not synchronized. Wherein the new four clock phases are selected to prevent the selected four clock phases from leading or lagging the serial data stream.

Figure 3:
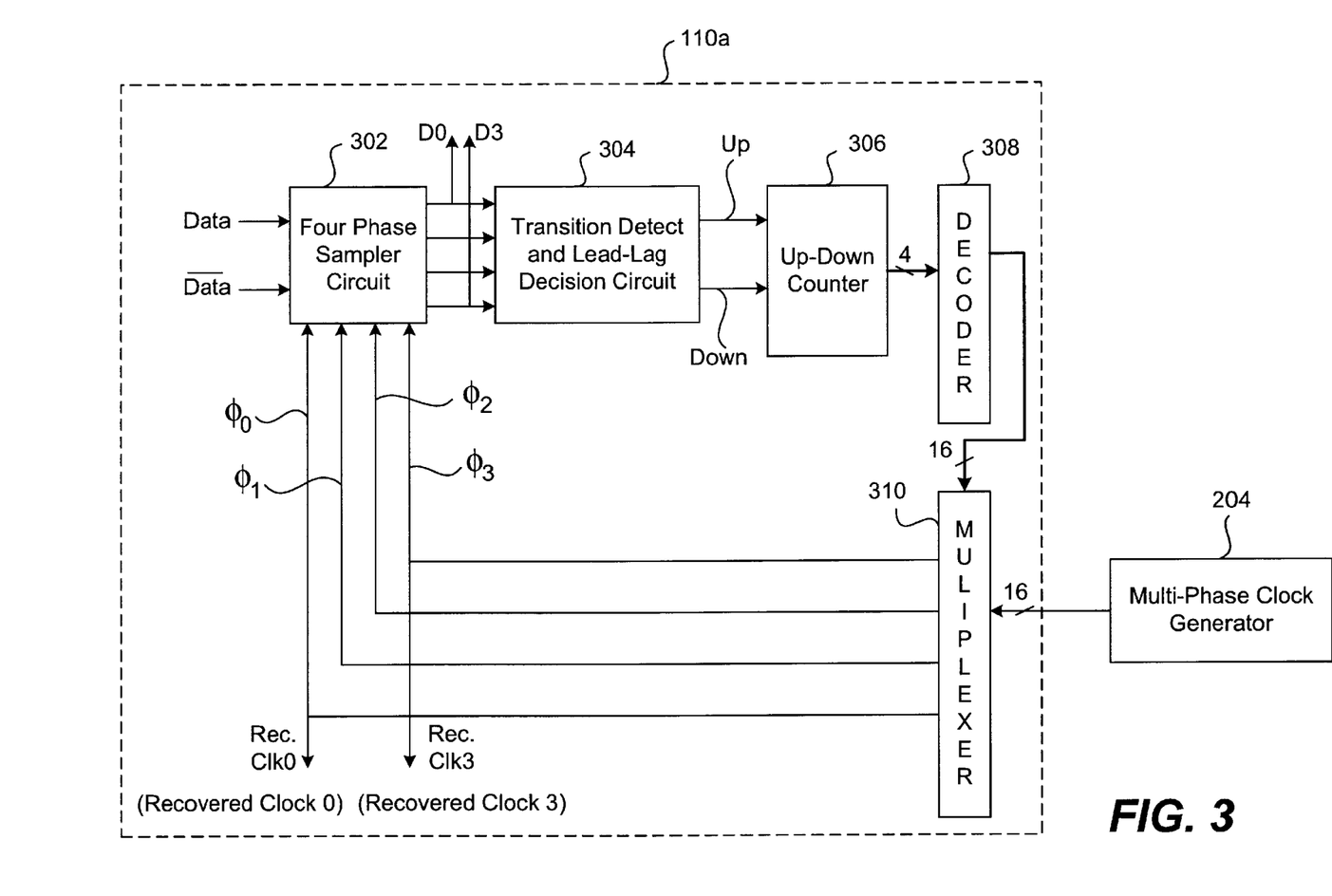
FIG. 3 shows a circuit level diagram of the components contained in the multi-phase data/clock recovery unit in accordance with one embodiment of the present invention.
Figure 6A:
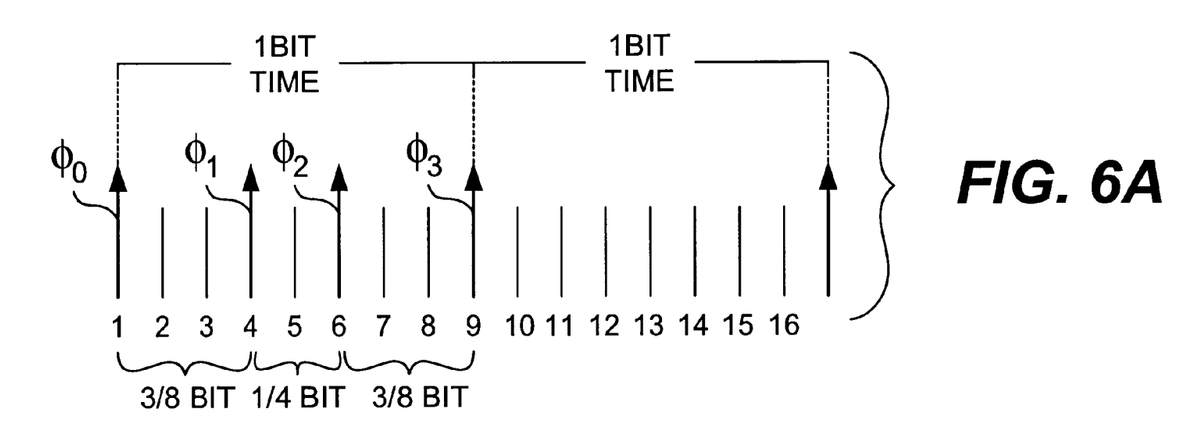
FIGS. 6A and 6B are pictorial representations of exemplary 16 clock phases generated by a multi-phase generator, and 4 selected clock phases that are used to map to the serial input NRZ data in accordance with one embodiment of the present invention.

In another embodiment, a data/clock recovery circuit is an important feature of a receiver for gigabit transceiver applications. A data/clock recovery circuit (as shown in FIG. 3 below) is based on the multiple phase clocks to over-sample the incoming serial data stream and a multi-phase digital phase locked loop (DPLL) to shift and rotate unlimitedly four sampling phases, which are selected from the multi-phase clock generator. Every two serial NRZ data bits are sampled with four sampling phases. The first sampling phase and the fourth sampling phase are separated exactly at a bit-time, and they should be located at the centers of the data eyes, once they have locked with the incoming data. The second sampling phase and the third sampling phase are separated at a quarter of the bit time as shown in FIG. 6A below.

The first and second sampling phases should be separated at three eighth of the bit-time. The third and fourth sampling phases should be also separated at three eighth of the bit-time. After the input four phase sampler, a NRZ data transition detection circuit and a lead-lag decision circuit are used to decide whether the first and the fourth sampling phases are at the centers of their respective data eyes. The lead-lag decision circuit will generate the UP control signal or the DOWN control signal, or NO CHANGE to control a 4 bit up-and-down counter. The output of the counter will be decoded into one selective line which in turn controls a multiplexer to select the four sampling phases from the multi-phase clock generator.

The four selected sampling phases are fed back to the input sampler to over-sample the incoming serial data. This feedback circuit completes the digital phase locked loop. The re-timed data bits are shifted out from the input sampler by using the first sampling phase clock and the fourth sampling phase clock alternatively. In addition, by over-sampling two serial NRZ data bits, this invention reduces the maximum clock speed to half of the baud rate which makes itself very suitable as a CMOS implementation. Furthermore, this invention provides built-in high frequency jitter reduction as a wide band low pass filtering effect, provided by the digital phase locked loop. The advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention is described for a multi-phase data/clock recovery system for use in high speed networking circuit applications. In the following description, numerous specific details are set forth in order to provide a thorough understanding of the present invention. It will be obvious, however, to one skilled in the art, that the present invention may be practiced without some or all of these specific details. In other instances, well known process operations have not been described in detail in order not to unnecessarily obscure the present invention.

Figure 1:
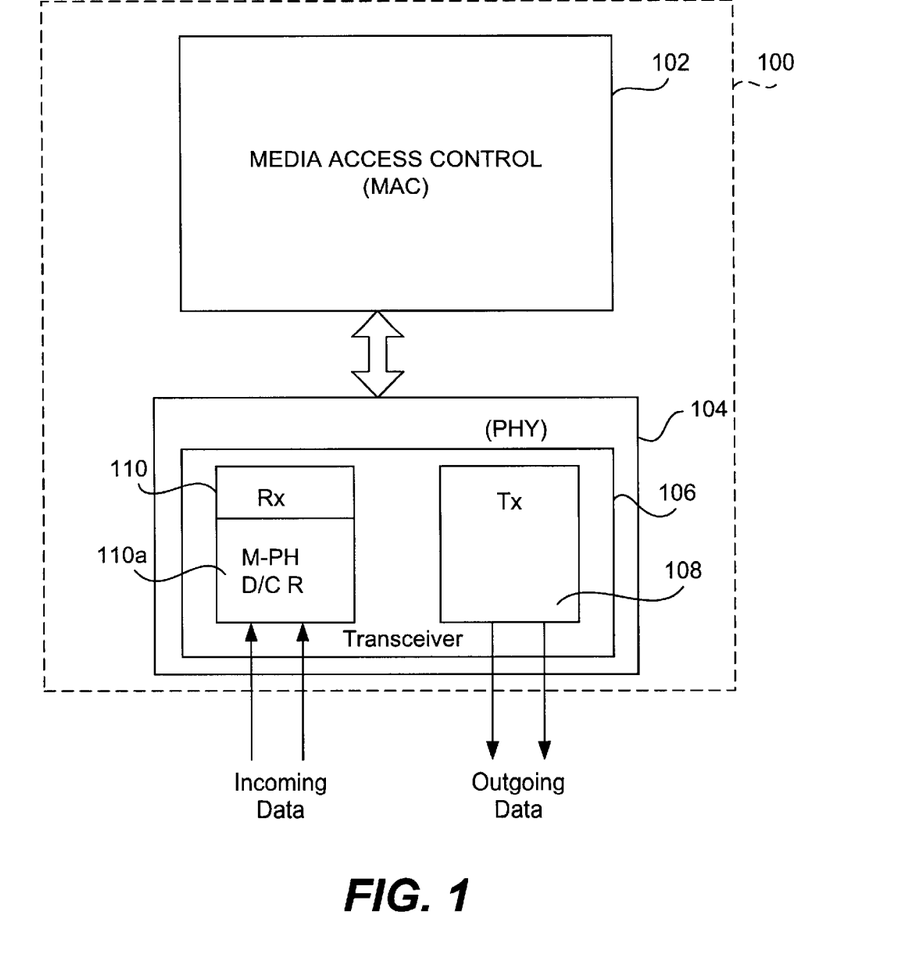
FIG. 1 shows a high level block diagram of high speed networking circuitry having a digital multi-phase data/clock recovery unit in accordance with one embodiment of the present invention.

FIG. 1 is a high-level block diagram of high speed networking circuitry 100 having a multi-phase data/clock recovery unit 110a in accordance with one embodiment of the present invention. The high speed networking circuitry 100 is shown including a media access control (MAC) unit 102 for performing all of the well known data processing tasks used to communicate over a network. Although the multi-phase data/clock recovery unit 110a may be designed in a separate integrated circuit chip for use in applications other than networking applications, having the multi-phase data/clock recovery unit 110a integrated on a single chip with other MAC 102 circuitry provides a powerful "network on a chip" solution.

With this in mind, it should be understood the multi-phase data/clock recovery unit 110a can be integrated, for example, in CMOS technology with other compatible high speed CMOS based MAC 102 circuitry. For examples of such MAC 102 circuitry, reference may be made to the following commonly assigned U.S. patent applications: (1) Ser. No. 08/845,562, entitled "MEDIA ACCESS CONTROL ARCHITECTURES AND NETWORK MANAGEMENT SYSTEMS," (2) Ser. No. 08/845,563, entitled "MEDIA ACCESS CONTROL TRANSMITTER AND NETWORK MANAGEMENT SYSTEM," and (3) Ser. No. 08/845,272, entitled "MEDIA ACCESS CONTROL RECEIVER AND NETWORK MANAGEMENT SYSTEM." These applications are hereby incorporated by reference.

Continuing with the discussion of FIG. 1, coupled to the media access control (MAC) 102 circuitry is physical layer circuitry 104. The physical layer circuitry 104 generally includes, among other well known components, a transceiver unit 106 that has associated transmitter circuitry (Tx) 108, and receiver circuitry (Rx) 110. In accordance with one embodiment, the multi-phase data/clock recovery unit (M-PH D/C R) 110a is integrated with the receiver circuitry (Rx) 110. Generally, it is the multi-phase data/clock recovery unit 110a which receives incoming data (i.e., from a remote transmitter) and ensures that the clock is synchronized with the incoming data. Specifically, a particular advantageous feature of the present invention is that the multi-phase data/clock recovery unit 110a analyzes the incoming data signal and continually performs a number of phase sampling operations to detect whether an incoming data stream is synchronized with the internal clock. Through the selection of specific clock phases, the multi-phase data/clock recovery unit 110a is able to examine the transitions of the incoming data waveform, and thereby detect and correct the clock to bring it back into optimum synchronization.

As mentioned above, because the multi-phase data/clock recovery unit 110a may be integrated with the media access control (MAC) circuitry 102 on a single chip to produce a complete high speed "network on a chip" solution, a large number of existing and future networking devices may be brought to market much faster than conventional network devices. By way of example, the networking circuitry 100 may be quickly and efficiently integrated into networking devices, such as, routers, hubs, network interface cards, bridges, personal computers, and network computers (NCs).

Figure 2:
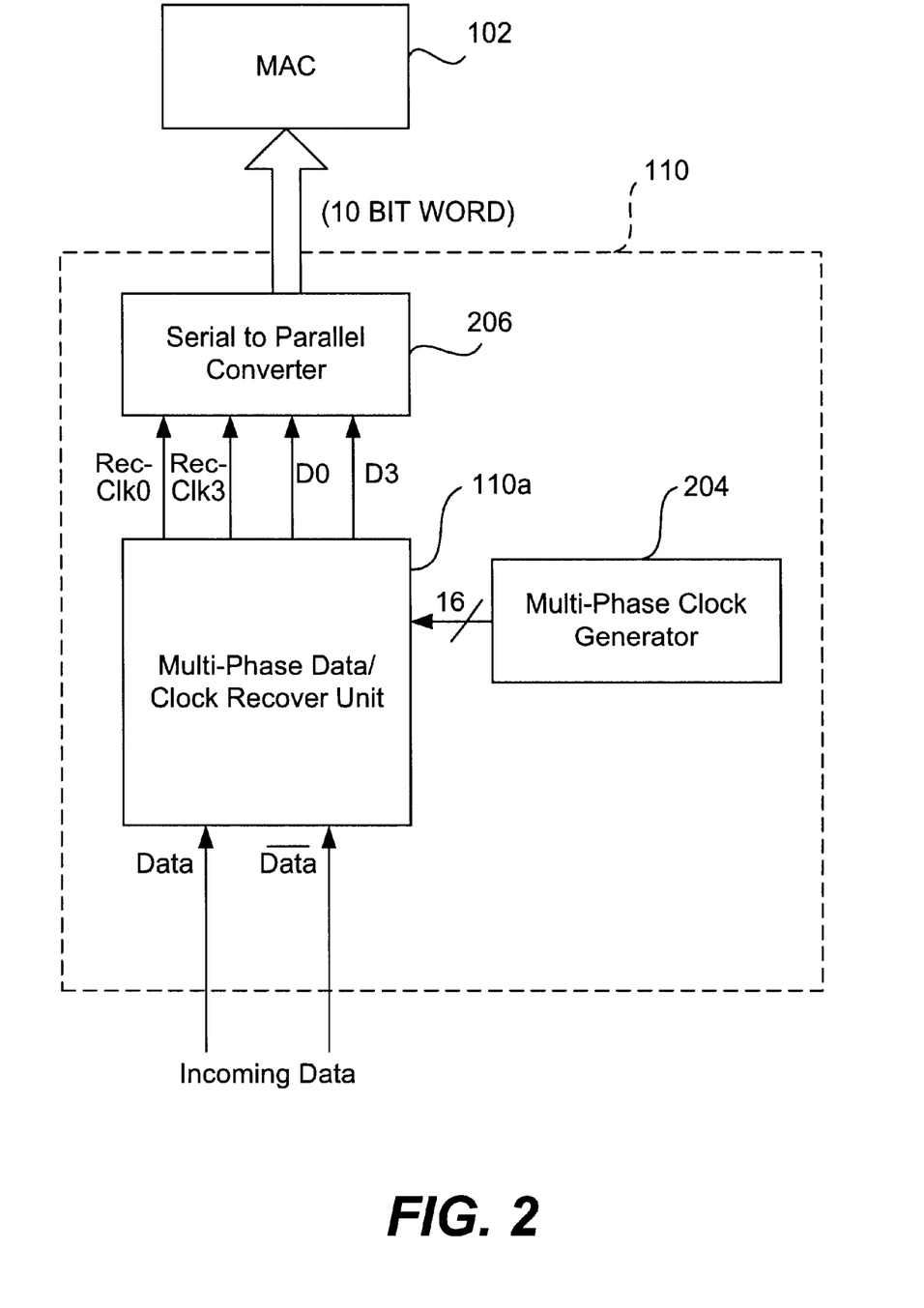
FIG. 2 shows a block diagram of the multi-phase data/clock recovery unit that is embodied in a receiver circuit in accordance with one embodiment of the present invention.

FIG. 2 is a block diagram of the multi-phase data/clock recovery unit 110a that is embodied in a receiver circuit 110 in accordance with one embodiment of the present invention. As shown, the receiver circuitry 110 will generally include the multi-phase data/clock recovery unit 110a. As shown, the data is being transferred to the multi-phase data/clock recovery unit 110a as a complementary data and /data input. Also shown to be an input to the multi-phase data/clock recovery unit 110a is a 16-bit bus that provides multiple clock phases generated in a multi-phase clock generator 204. Although a 16-bit bus is shown for purposes of understanding, it should be borne in mind that the bus and associated multi-phase clock generator 204 may be of any size, depending on the desired clock phase granularity need for analyzing a particular incoming data waveform.

The multi-phase data/clock recovery unit 110a will therefore use the incoming data and the 16-clock phases provided by the multi-phase clock generator 204 to produce a recovered clock$_0$, (CLK$_0$,) and a recovered clock$_3$ (CLK$_3$), and a data$_0$ (D$_0$) and a data$_3$ (D$_3$). An advantage of the multi-phase data/clock recovery unit 110a is that the data (i.e., D$_0$ and D$_3$) and recovered clock (i.e., CLK$_0$ and CLK$_3$) provided to a serial-to-parallel converter 206 will be processed at a much lower rate than the data baud rate to produce synchronized data and clock before the data is transferred to the media access control (MAC) 102 circuitry. In this embodiment, the data is transferred from the serial-to-parallel converter as a 10-bit word in compliance with the IEEE 802.3(z) gigabit Ethernet standard.

FIG. 3 is a circuit level diagram of the components contained in the multi-phase data/clock recovery unit 110a in accordance with one embodiment of the present invention. As shown, a four-phase sampler circuit 302 is used to receive the data and /data shown in FIG. 2 above. Further, the multi-phase clock generator 204 is shown providing the 16 clock phases to a multiplexer 310 which is controlled by a decoder 308. In this example, the four-phase sampler circuit 302 receives the incoming data and /data, and four clock phases from the multiplexer 310.

The multiplexer 310 will therefore select four programmable clock phases including, a phase $\Phi_0$, a phase $\Phi_1$, a phase $\Phi_2$, and a phase $\Phi_3$. Each of these clock phases are therefore input to the four-phase sampler circuit 302. At this point, the four-phase sampler circuit 302 will communicate the location of those phases with respect to the incoming data and/data to a transition detect and lead-lag decision circuit 304. The transition detect and lead-lag decision circuit 304 is well suited to ascertain whether the clock is either leading or lagging the data based upon the selected phases (i.e., phase $\Phi_0$ through phase $\Phi_3$).

If it is determined that the clock is lagging the data, then the transition detect and lead-lag decision circuit 304 will trigger an UP command that is transferred to an UP-DOWN counter 306. On the other hand, if the transition detect and lead-lag decision circuit 304 ascertains that the clock leads the data transition, then a DOWN command will be passed to the UP-DOWN counter 306. It is the UP-DOWN counter 306 that will shift the clock ahead if the clock is lagging the data transition, or will shift the clock back if the clock leads the data transition.

The UP-DOWN counter 306 will therefore output a four-bit signal to a decoder 308, which enables the selection mechanism by which the multiplexer 310 selects the appropriate clock phases that are passed to the four-phase sampler circuit 302. At this point, it should be noted that phases $\Phi_0$ and $\Phi_3$ will represent the recovered clocks that define the boundary of a "bit time." As such, phase $\Phi_0$ will produce a clock (CLK$_0$) that identifies either a digital data 0 or a digital data 1. In a like manner, the phase $\Phi_3$ will produce a clock (CLK$_3$) that identifies the exact location of the next bit, which may be a digital data 1 or 0.

As such, data$_0$ (D$_0$) and data$_3$ (D$_3$) will represent the data that is synchronized with the corresponding recovered clock. Therefore, it should be appreciated that the circuitry of the multi-phase data/clock recovery unit 110a is optimized to continuously analyze the incoming data and correct for any detected offsets in the clock.

Figure 4A:
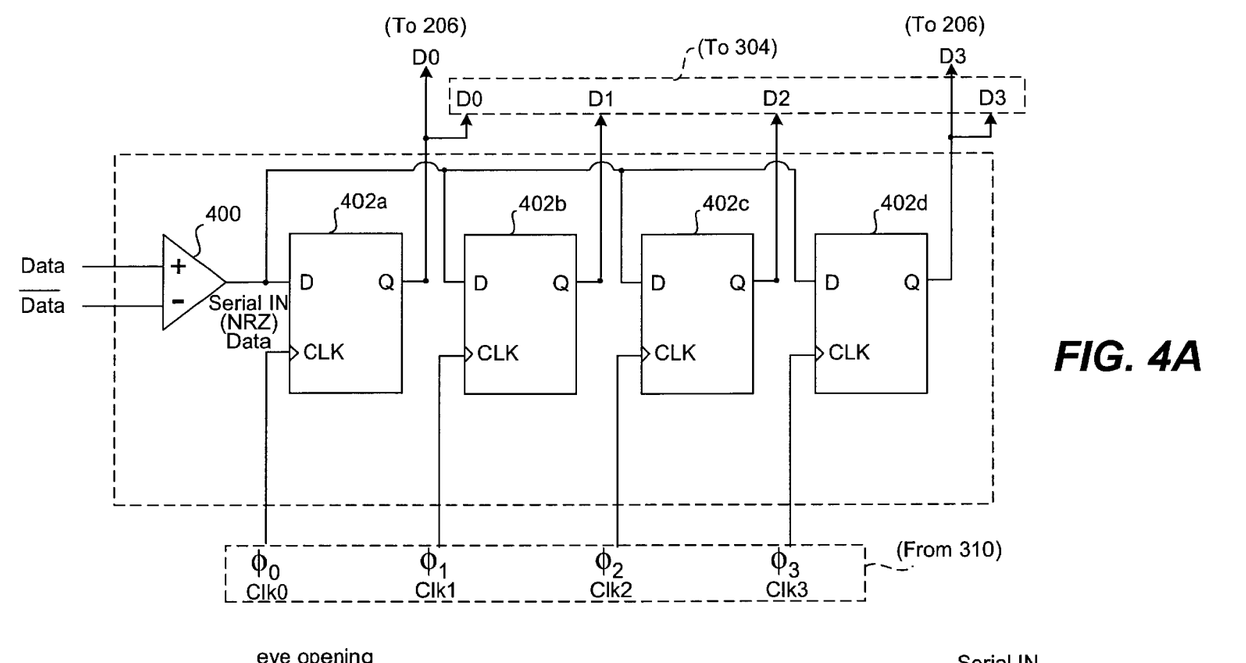
FIG. 4A shows an exemplary circuit level diagram of the components contained in a four phase sampler circuit of the multi-phase data/clock recovery unit in accordance with one embodiment of the present invention.

FIG. 4A is an exemplary circuit level diagram of the components contained in the four-phase sampler circuit 302 of the multi-phase data/clock recovery unit 110a in accordance with one embodiment of the present invention. As shown, the data and /data is shown as inputs to a data buffer 400, which is well suited to output a serial input (NRZ) data in compliance with the gigabit Ethernet standard. The input data is then provided to four flip flops 402a–402d that function as a four phase sampler circuit. Each flip flop is latched on the rising edge clock and is provided with its own clock phase. The first flip flop 402a receives a phase $\Phi_0$ (CLK$_0$) signal.

Flip flop 402b is provided with a clock input of a phase $\Phi_1$ (CLK$_1$). The output of flip flop 402a is shown coupled to data$_0$ (D$_0$), that represents either a digital data 1 or 0. Flip flop 402c is provided with a clock input of a phase $\Phi_2$ (CLK$_2$). The output of flip flop 402b is coupled to provide a data$_1$ (D$_1$). Flip flop 402d is also provided with a clock input of a phase $\Phi_3$ (CLK$_3$). The output of flip flop 402c is also provided as an output to a data$_2$ (D$_2$). The output of flip flop 402d is also provided as a output to data$_3$ (D$_3$). Therefore, phase $\Phi_0$, phase $\Phi_1$, phase $\Phi_2$, and phase $\Phi_3$ are provided as inputs to the four-phase sampler circuit 302 from the multiplexer 310, as shown in FIG. 3 above. In addition, the data $D_0$, $D_1$, $D_2$, and $D_3$ are provided as inputs coming from the four-phase sampler circuit 302 and into the transition detect and lead-lag decision circuit 304.

Figure 4B:
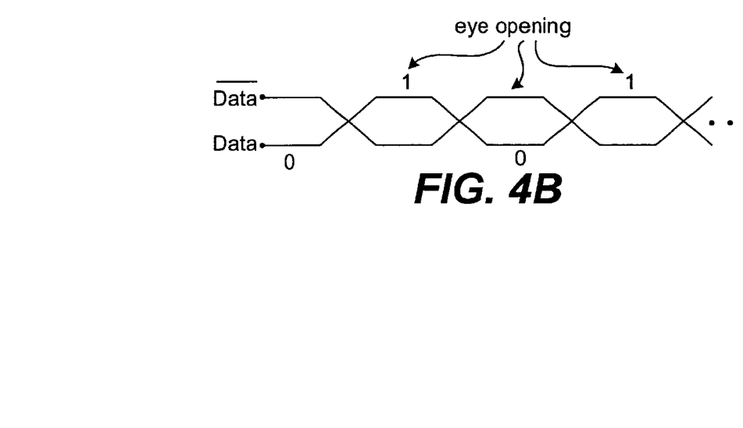
FIGS. 4B and 4C shows exemplary waveforms that are processed through the four phase sampler circuit in accordance with one embodiment of the present invention.
Figure 4C:
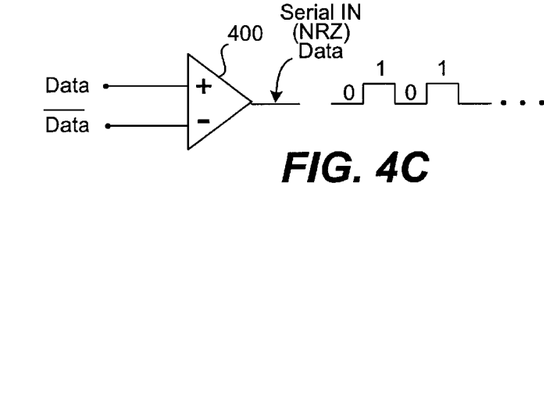

FIGS. 4B and 4C show the representative waveforms of data and/data, where a digital 0 or a digital 1 is provided at each eye opening. It is this waveform that is provided to the data buffer 400, and thereby converted into the serial input (NRZ) data shown in FIG. 4C.

Figure 5:
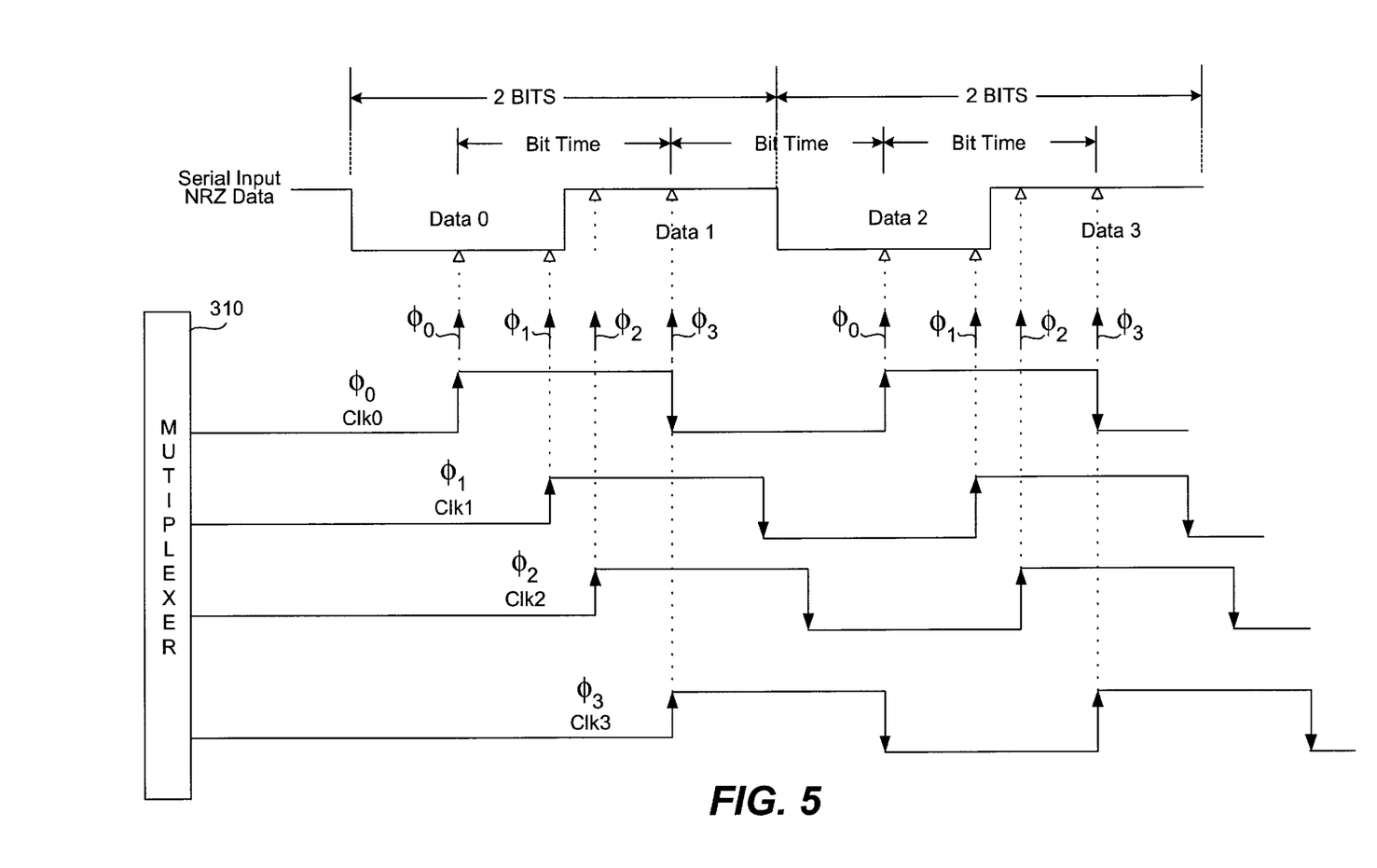
FIG. 5 shows a detailed diagram of a serial input NRZ data and selected clock phase signals that are mapped to the serial input NRZ data in accordance with one embodiment of the present invention.

FIG. 5 is a detailed diagram of a serial input NRZ data waveform and associated selected clock phase signals that are mapped to the serial input NRZ data in accordance with one embodiment of the present invention. As shown, each of the selected clock phases are output from the multiplexer 310 to produce the waveforms for phase $\Phi_0$ ($CLK_0$), phase $\Phi_1$ ($CLK_1$), phase $\Phi_2$ ($CLK_2$), and phase $\Phi_3$ $_{(CLK3)}$. Therefore, each rising edge of the phase clock signals will represent a selected phase, that is mapped to the serial input NRZ data waveform. Accordingly, phase $\Phi_0$ will be accurately mapped to the center of data 0, and the phase $\Phi_3$ rising edge will be mapped directly to the center of data 1 of the next bit.

In this embodiment, the clock is shown to be synchronized with the data. In addition, two additional clock phases ($CLK_1$ and $CLK_2$) are shown mapped to the serial input NRZ data at a location that is just before the data transition and just after the data transition, respectively. In this manner, the transition detect and lead-lag decision circuit 304 of FIG. 3 will be able to ascertain whether the selected phase clock signals are synchronized to the serial input NRZ data. That is, if $CLK_0$ and $CLK_1$ are either both 0 or both 1, and $CLK_2$ and $CLK_3$ are either all both 0 or both 1, then the clock will be considered synchronized with the data.

On the other hand, if three successive phases of the four phases are mapped to either 0 or either 1, then it will be ascertained that a non-synchronization event has occurred between the clock and the data. At this point, the transition detect and lead-lag decision circuit 304 will either shift the clock ahead or shift the clock back to synchronize the clock and data to resemble the mapping illustrated in FIG. 5. As mentioned above, the time span between each digital data bit (i.e., 1 or 0) will be identified as a bit-time.

It is also important to note that each of the four clock phases that are selected by the multiplexer 310 are actually processing two digital bits at one time. As a result, the digital circuitry is able to analyze data being received at gigabit speeds and higher, and only process at half the speed. By way of example, if the incoming data is being received at about one gigabit per second, the multi-phase data/clock recovery unit 110a will be virtually operating at half that rate (i.e., about 500 Mbps per second).

FIG. 6A shows a graphical representation of exemplary 16 clock phases generated by the multi-phase generator 204 in accordance with one embodiment of the present invention. For ease of discussion, each of the 16-bit-wide phases produced by the decoder 308 of FIG. 3 are numbered for ease of discussion. As shown, phase $\Phi_0$ is associated with number 1, phase $\Phi_1$ is associated with number 4, phase $\Phi_2$ is associated with number 6, and phase $\Phi_3$ is associated with number 9.

The selection of these four phases is therefore configured to produce a separation between phase $\Phi_0$ and phase $\Phi_1$ to be about ⅜ bit. The separation between phase $\Phi_1$ and phase $\Phi_2$ is configured to be about ¼ bit. Finally, the separation between phase $\Phi_2$ and phase $\Phi_3$ is configured to be about ⅜ bit. With this novel selection and separation of the aforementioned selected four phases, it is possible to detect both the center of each digital data in a serial input NRZ data waveform, as well as the transition between digital data values. As such, if it is determined that the four phases are either lagging or leading of the serial input NRZ data, the UP-DOWN counter 306 will command the decoder 308 to select different ones of the phases produced by the multi-phase clock generator 204.

Figure 6B:
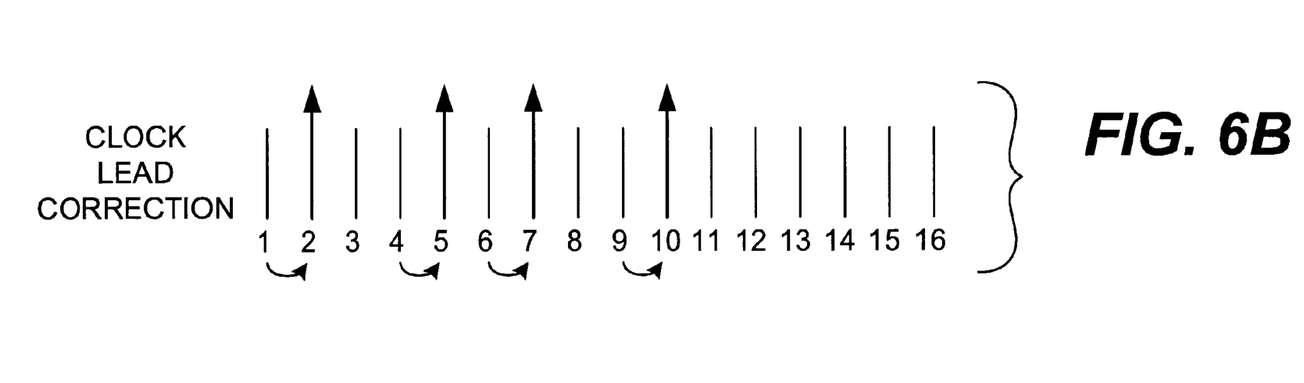

As shown in FIG. 6B, the four phases have been shifted down by one decrement to compensate for cases in which the clock is leading the serial input NRZ data waveform. After the correction, it is shown that the phase $\Phi_0$ is positioned at number 2, the phase $\Phi_1$ is positioned at number 5, the phase $\Phi_2$ is positioned at number 7, and the phase $\Phi_3$ is positioned at number 10. Of course, if the clock were to be behind the data, a correction would occur such that the clock phases would be shifted up. It should be understood, that although only 16 granular increments are provided by the multi-phase clock generator 204, other suitable multi-phase clock generators may be implemented to provide a phase granularity that is more dense or less dense, depending on a particular application.

Figure 7A:
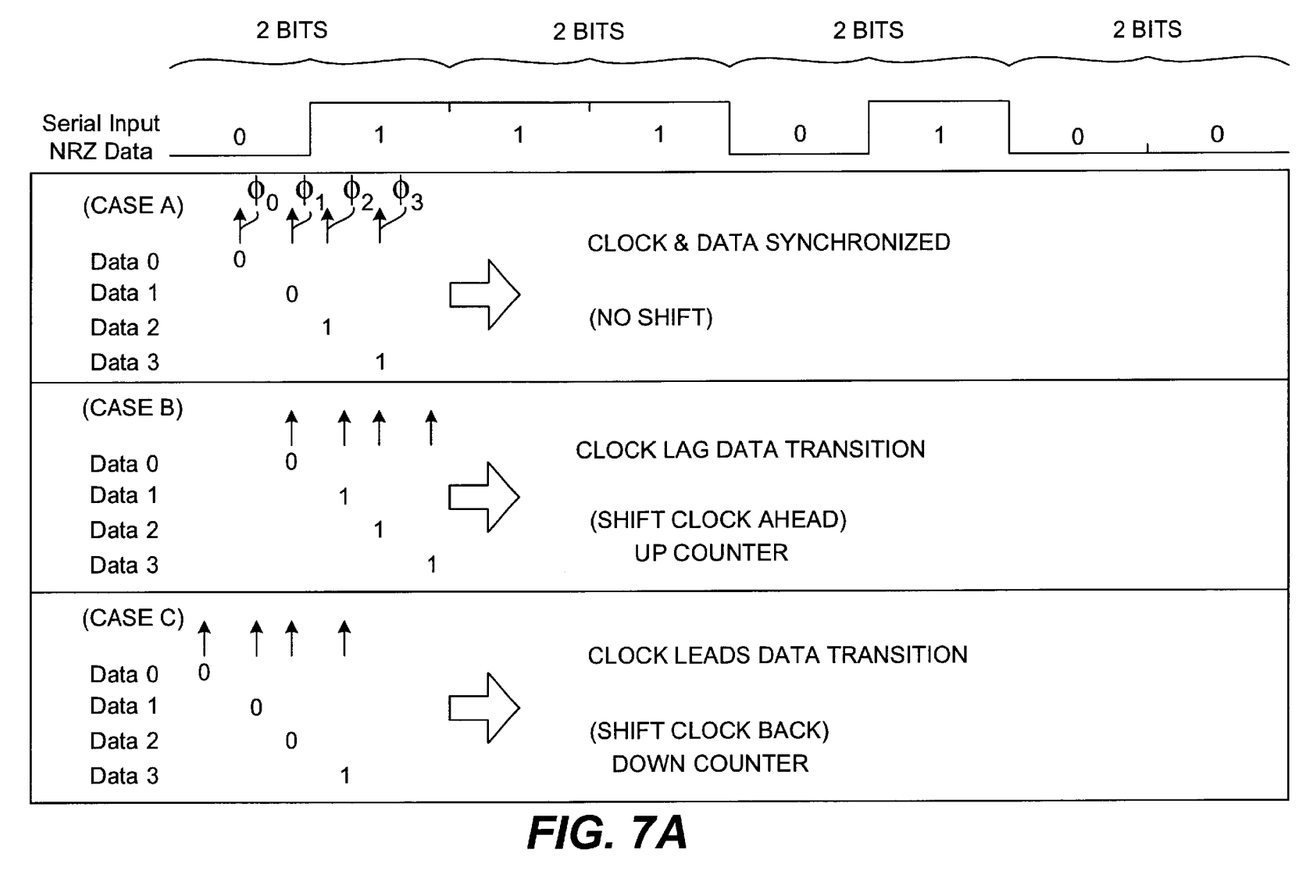
FIG. 7A shows three hypothetical situations in which the 4 selected clock phases are synchronized to the data, lagging the data, and leading the data in accordance with one embodiment of the present invention.

FIG. 7A shows a serial input NRZ data waveform and corresponding clock phases for three hypothetical cases in accordance with one embodiment of the present invention. In case A, phase $\Phi_0$ and phase $\Phi_1$ are both mapped to a digital 0 on the serial input NRZ data waveform. In a like manner, phase $\Phi_2$ and phase $\Phi_3$ are both mapped to a digital data of 1. As a result, the clock and the data are said to be synchronized and therefore, the multi-phase data/clock recovery unit 110a will not perform a correction of the clock phases.

In case B, phase $\Phi_0$ is shown mapped to a digital 0 in the serial input NRZ data. However, phase $\Phi_1$, phase $\Phi_2$, and phase $\Phi_3$ are all mapped to a digital 1 on the serial input NRZ data. As a result, the first phase will produce a 0, and the next three phases will produce a 1. This situation will therefore cause the transition detect and lead-lag decision circuit 304 to ascertain that a clock correction is necessary. In this case, the transition detect and lead-lag decision circuit 304 of FIG. 3 will ascertain that the clock will be lagging the data transition. Therefore, the corrective action taken by the UP-DOWN counter 306 will be such that the clock will be shifted ahead when the UP counter is applied.

In the final case C, there is shown a situation where the first three phases (phase $\Phi_0$, phase $\Phi_1$, and phase $\Phi_2$) are all mapped to a digital data 0 on the serial NRZ data waveform. However, phase $\Phi_3$ is mapped to a digital data 1 on the serial input NRZ data waveform. This case will also be detected as a case which needs correction by the transition detect and lead-lag decision circuit 304 of FIG. 3. By way of example, the clock will be leading the data transition, and therefore, a correction in the form of a back shift of the clock will be performed by the DOWN counter of 306.

Figure 7B:
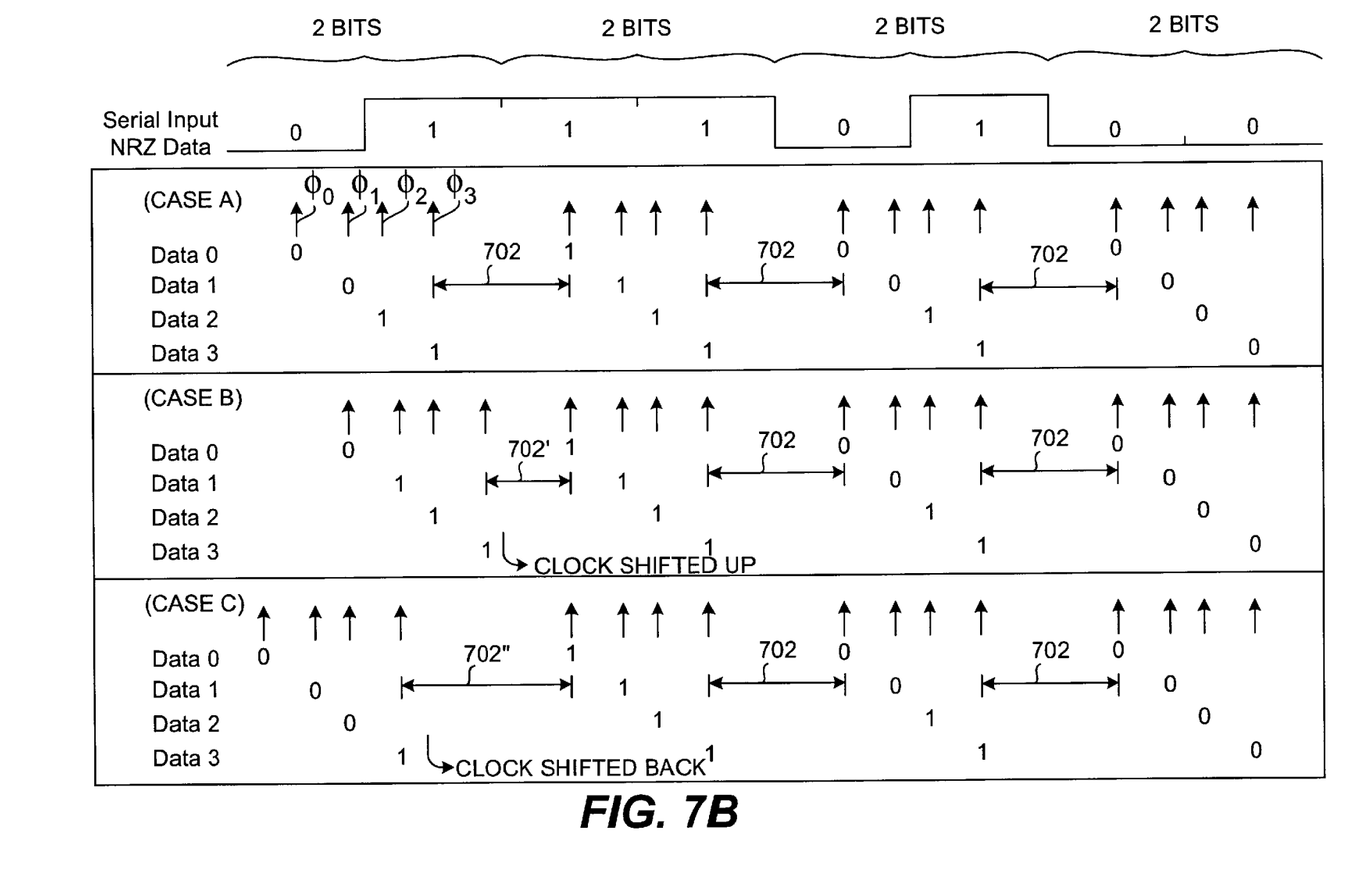
FIG. 7B pictorially shows cases where the 4 selected clock phases are corrected (i.e., shifted) to avoid the lagging situation and the leading situation in accordance with one embodiment of the present invention.

FIG. 7B shows the serial input NRZ data waveform of FIG. 7B and case A, case B, and case C completed after corrections are performed in accordance with one embodiment of the present invention. In case A, because two digital 0's are mapped to phase $\Phi_0$ and phase $\Phi_1$, and two digital 1's are mapped to phase $\Phi_2$ and phase $\Phi_3$, the clock is said to be synchronized with the serial input NRZ data waveform. This is because phase $\Phi_0$ is mapped to the center of the digital 0 data, and the phase $\Phi_3$ is mapped to the middle of the next bit, which is a digital 1. In addition, phase $\Phi_1$ and phase $\Phi_2$ define the transition between the two bits of the serial input NRZ data waveform.

Also shown is a case where all ones are produced by the four phases, when phase $\Phi_0$, phase $\Phi_1$, phase $\Phi_2$, and phase $\Phi_3$ are centered about the next two bits, which are both digital 1. In this case, when all ones are produced, the transition detect and lead-lag decision circuit 304 will determine that no correction will be performed at this point. For the third set of two bits, the four phases will produced two 0's and two 1's, which will again not require correction of the clock. Finally, the fourth set of two bits will produced all 0's, which will be examined by the transition detect and lead-lag decision circuit 304. As in the case of all 1's, when all 0's are produced, the transition detect and lead-lag decision circuit will postpone any decision of correction until a waveform having a transition is examined.

Also pictorially illustrated is a processing bandwidth (BW) 702, which lies between each of the four sets of phases. This processing bandwidth 702 therefore defines a period of time in which a correction may be performed if indeed, the clock was either leading or lagging the serial input NRZ data waveform. For an illustration of the use of this processing bandwidth 702, reference will now be drawn to cases B and C of FIG. 7B.

In case B, it is noted that the first four phases will produce a 0 and three 1's. When a 0 and three 1's are produced, a transition detect and lead-lag decision circuit 304 will ascertain that the clock is lagging a data transition and therefore, will require correction. During a processing bandwidth 702', the clock will be shifted UP in order to synchronize the clock with the serial input NRZ data waveform.

Once the clock has been shifted Up to correct the lag in the clock, the next four phases will be synchronized with the serial input NRZ data waveform. When such correction is performed, the following sequence of four phases will also continue to be synchronized. However, if a dis-synchronization occurs, the multi-phase data/clock recovery unit 110a will be well suited to correct that dis-synchronization during the processing bandwidth 702.

In case C, there is shown a case where the first four phases produce three 0's and a 1. This situation will therefore be interpreted by the transition detect and lead-lag decision circuit 304 to be a case where the clock leads the data transition. When the clock leads the data transition, the down counter of 306 will shift the clock "back" to synchronize the clock with the serial input NRZ data. Again, the processing bandwidth 702" is a time in which the multi-phase data/clock recovery unit 110a may process any correction for cases where the clock leads the data transition. Once the correction has been imposed, the following sequences of four phases will be synchronized. However, as mentioned above, if any dis-synchronization event occurs, the multi-phase data/clock recovery unit 110a will be well suited to correct such dis-synchronization during processing bandwidth 702.

Figure 8A:
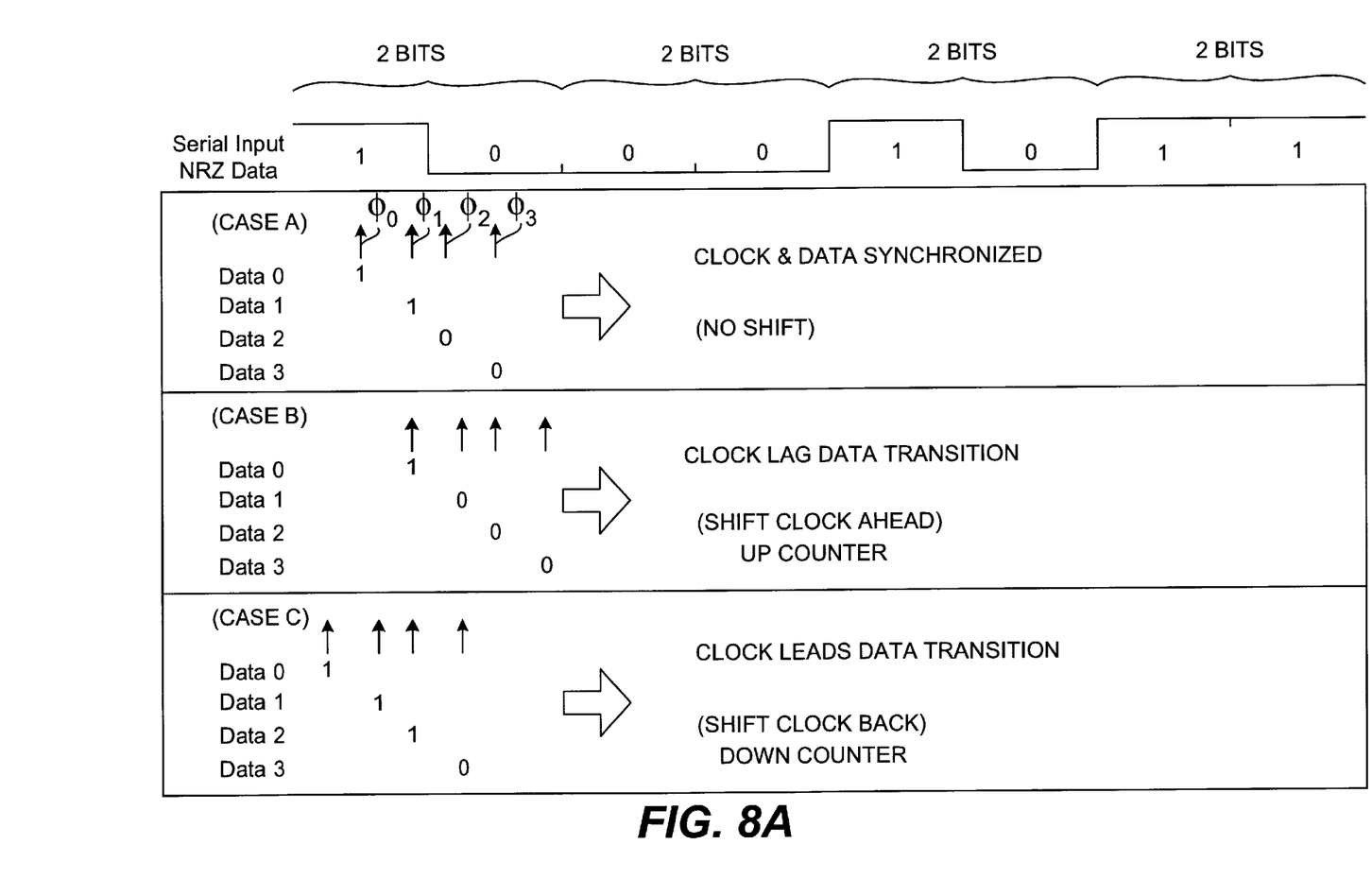
FIGS. 8A and 8B illustrate corrective shifts that are performed to correct the lagging situation and the leading situation when the serial input NRZ data is an inverse to the waveform of FIGS. 7A and 7B in accordance with one embodiment of the present invention.

FIG. 8A shows a serial input NRZ data waveform which is an inverse of the serial input NRZ data waveform of FIGS. 7A and 7B in accordance with one embodiment of the present invention. In case A, there is shown a case where the clock and data are synchronized because two digital 1's are produced with the first two phases, and two digital 0's are produced by the second two phases. As such, no clock correction will be performed.

In case B, there is a situation where the first phase produces a digital 1, and the next three phases produce three digital 0's. In this case, the transition detect and lead-lag decision circuit 304 will ascertain that the clock is lagging the data transition. Therefore, the clock will be shifted ahead by the UP counter of 306 of FIG. 3.

In case C, the first three phases will produce digital 1's, and the fourth phase will produce a digital 0. Therefore, the three digital 1's and one digital 0 will be a case that the transition detect and lead-lag decision circuit 304 will designate as a case where the clock leads the data transition. Again, the DOWN counter of 306 of FIG. 3 will be implemented to shift the clock back in order to synchronize the clock with the serial input NRZ data waveform.

Figure 8B:
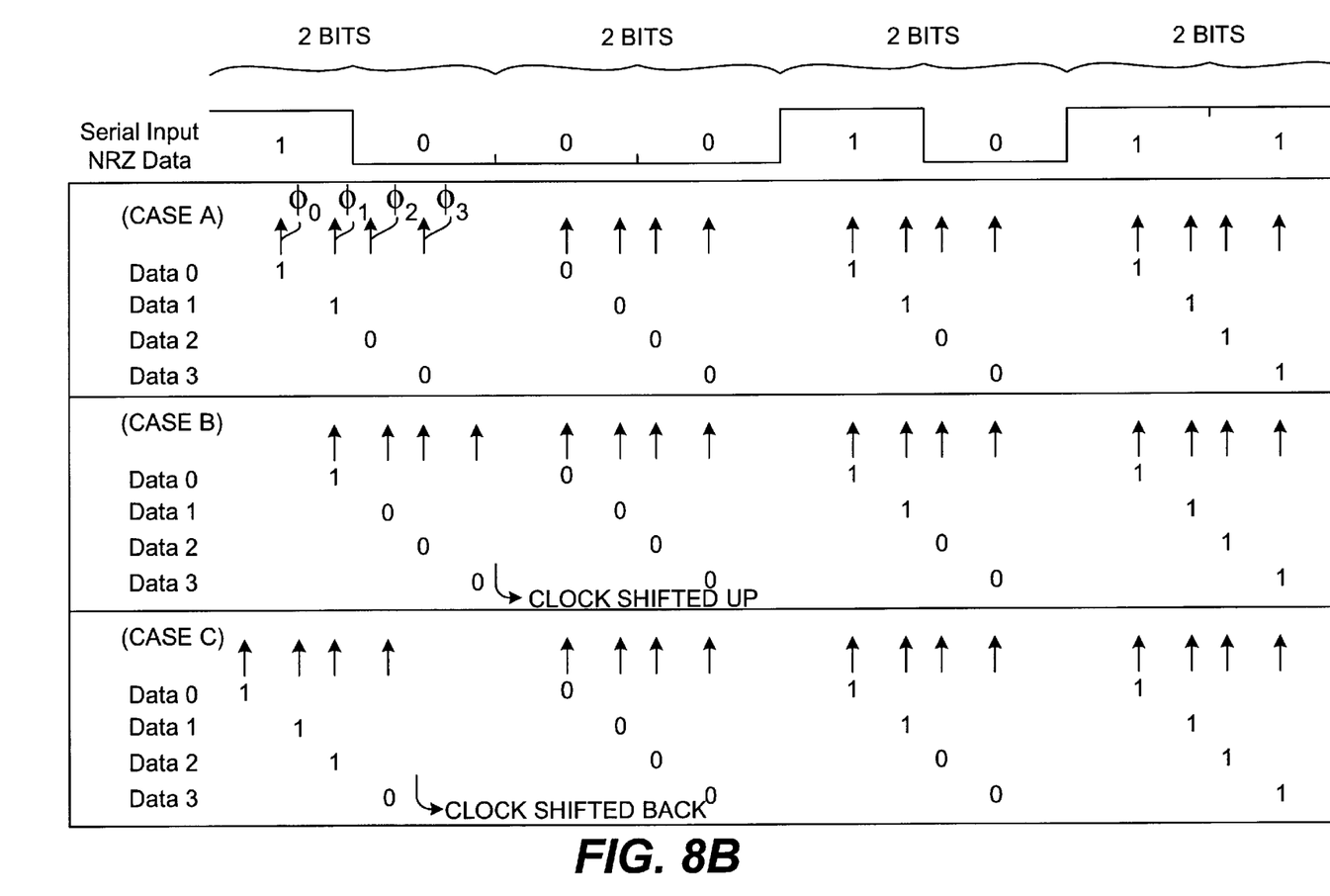

FIG. 8B shows the serial input NRZ data waveform of FIG. 8A and the corrective actions taken by the multi-phase data/clock recovery unit 110a in accordance with one embodiment of the present invention. In case A, because the clock is synchronized with the serial input NRZ data waveform, no correction will be performed. However, in case B and case C, corrections will be performed to shift UP the clock and shift back the clock, respectively. By way of example, in case B, the four phases will produce a digital 1 and three digital 0's, which will be interpreted by the transition detect and lead-lag decision circuit 304 to be a situation where the clock lags the data transition. To correct such a case, the UP counter of 306 of FIG. 3 will be implemented to shift the clock ahead. Once the clock has been shifted ahead, the four phases will be synchronized with the serial input NRZ data waveform.

In case C, the first three phases will produce digital 1's, and the fourth phase will produce a digital 0. This situation will be interpreted by the transition detect and lead-lag decision circuit 304 to be a case where the clock leads the data transition. To correct such a case, the DOWN counter of 306 of FIG. 3 will be used to shift the clock back in order to correct the offset. Once the clock has been shifted back, the next four phases will produce all 0's, which will cause to the transition detect and lead-lag decision circuit to perform no corrective action. The third set of four phases will produce two 1's and two 0's, which will indicate that the data and clock is synchronized.

Figure 9:
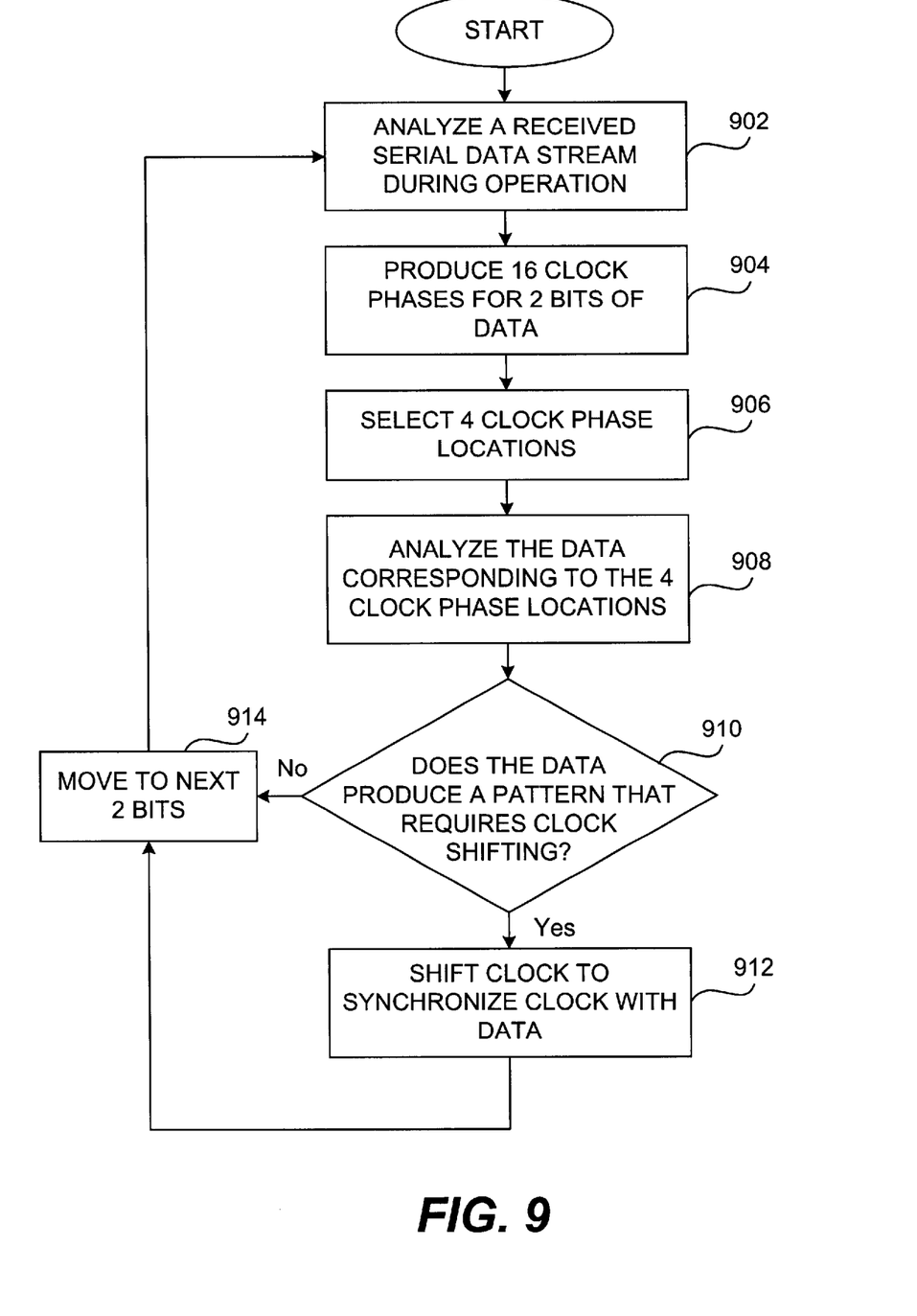
FIG. 9 shows a flowchart diagram of the preferred method operations that are performed to configure a multi-phase data/clock recovery system to perform the shifting operations illustrated in FIGS. 7A through 8B in accordance with one embodiment of the present invention.

FIG. 9 is a flowchart diagram of the preferred method operations that are performed to configure a multi-phase data/clock recovery unit to perform the shifting corrective operations illustrated in FIGS. 7A through 8B in accordance with one embodiment of the present invention. The method begins at an operation 902 where a received serial data stream is analyzed during the operation of a network device in which the multi-phase data/clock recovery unit has been integrated. The method then proceeds to an operation 904 where 16 clock phases are produced for two bits of incoming data. As mentioned above, although 16 clock phases are produced in accordance with one embodiment of the present invention, the multi-phase clock generator 204 of FIG. 3 may be modified to generate any number of clock phases for the two bits of data.

The method then proceeds to an operation 906 where four clock phase locations are selected from the produced 16 clock phases. As described above, the multiplexer 310 is preferably used to select the desired four phases having the preferred phase orientations described with reference to FIG. 6A. Once the four clock phase locations have been selected in operation 906, the method will proceed to an operation 908 where the data corresponding to the four clock phase locations are analyzed. As mentioned above, the four clock phase locations are analyzed by the transition detect and lead-lag decision circuit 304 to ascertain whether the data and clock are synchronized.

The method will now proceed to a decision operation 910 where it is determined whether the data produces a pattern that requires clock shifting. If the pattern does require clock shifting, the method will proceed to an operation 912 where the clock is shifted to synchronize the clock with the data.

Once the clock has been shifted, for example, by the UP-DOWN counter 306 of FIG. 3, the method will proceed to an operation 914 where the method moves to the next two bits. On the other hand, if it is determined in decision operation 910 that the pattern does not require shifting (i.e., as in case A of FIGS. 7A through 8B), the method will proceed directly to operation 914. Once the method has moved to the next two bits, the method will again proceed through operations 902 and 914 while the network device in which the multi-phase data/clock recovery unit is, in integrated in or in communication with, in operation.

In sum, the various embodiments of the present invention avoid the problems associated with conventional transceivers, because only one analog PLL (e.g., the multi-phase clock generator 204) is used to lock to the external reference clock and to generate multiple phase clocks for both the transmitter and the receiver. Therefore, both the transmitter and the receiver share the same clock source, which therefore prevents crosstalk between the transmitter and the receiver. As can be appreciated, this feature will make the implementation of multi-channel transceiver applications easier because the multi-phase clock generator 204 can be shared by all the transceivers, and the crosstalk between all channels will be minimized.

Furthermore, the digital multi-phase data/clock recovery circuit 110a is less sensitive to coupling noise than its analog counterpart. The digital multi-phase data/clock recovery circuit 110a of the present invention uses a four phase sampler to over-sample the incoming serial data stream. Every two serial NRZ data bits will be sampled by four selected sampling phases. This provides four data samples for every two data bits.

The first two samples should be identical and the last two samples should also be identical once the digital multi-phase data/clock recovery circuit 110a has locked with the incoming data stream. The first sampling phase re-timed the first serial data bit "$D_0$" and outputs it to the shift register of the de-serializer. The fourth sampling phase re-timed the second serial data bit "$D_3$" (i.e., at exactly one bit time later) outputs it to the shift register of the de-serializer. The data recovery is done serially based on the two recovered sampling clocks (i.e. the first sampling clock "$CLK_0$" and the fourth sampling clock "$CLK_3$").

The clock recovery is done by properly choosing four sampling phases from the multi-phase clock generator 204. The first sampling phase and the fourth sampling phase are separated exactly at a bit-time, and they should be located at the centers of the data eyes once they have locked with the incoming data. The second sampling phase and the third sampling phase are separated at a quarter of the bit time (as shown in FIG. 6A above). The first and second sampling phases should be separated at three eighth of the bit-time. The third and fourth sampling phases should be also separated at three eighth of the bit-time. The NRZ data transition detection circuit and the lead-lag decision circuit will center the input data transition between the second sampling phase and the third sampling phase, based on the four sampling data.

If the first three samples are identical but the last sample is different, the recovered clock leads the re-timed data. The lead-lag decision circuit will generate a DOWN control signal to count down the 4 bit up-down counter by one count. A phase-selective signal generated from decoding the counter output will delay the four sampling phases by multiplexing out another set of four sampling phases with a predetermined phase shift from the present four phase sampling clocks.

If the last three samples are identical but the first sample is different, the recovered clock lags the re-timed data, as shown in FIGS. 7A–8B above. The lead-lag decision circuit 304 will generate an UP control signal to count up the 4 bit up-down counter by one count. A phase-selective signal generated from decoding the counter output will speed up the four phase sampling clocks by multiplexing out another set of four sampling phases with a predetermined phase shift from the present four sampling phases. In one embodiment, the rest of the combinations from the four sampling data will preferably not cause any changes in the selection of the four sampling phases. Therefore, the lead-lag decision circuit 304 will not generate an UP or DOWN signal. As such, the up-down counter will remain the same output as the previous count, and the four sampling phases will remain the same as before. Consequently, no phase correction is performed. This advantageously provides high frequency jitter reduction as a wide band low pass filtering effect provided by the digital phase locked loop.

As used herein, reference to the IEEE 802.3 standard shall be understood to include all current IEEE 802.3 standards, including: (a) IEEE 802.3u standard (100 Mbps-Fast Ethernet) IEEE std 802.3u-1995; (b) IEEE 802.3z standard (1000 Mbps-Gigabit Ethernet); and (c) ISO/IEC 8802-3, ANSI/IEEE Std 802.3 (fifth edition 1996). All above identified standards are hereby incorporated by reference.

Although the foregoing invention has been described in some detail for purposes of clarity of understanding, it will be apparent that certain changes and modifications may be practiced within the scope of the appended claims. It should be understood that the various processing functions described above may be implemented both in silicon as hardware integrated circuits, or as software code that may be stored and retrieved from any suitable storage medium. Accordingly, the present embodiments are to be considered as illustrative and not restrictive, and the invention is not to be limited to the details given herein, but may be modified within the scope and equivalents of the appended claims.

What is claimed is:

1. A method for implementing a data/clock recovery system in a network device receiver, the network device receiver being configured to receive a serial data stream, comprising:

producing a plurality of clock phases for every two bits of the serial data stream;

selecting four clock phases from the plurality of clock phases, the four clock phases having a predetermined separation;

analyzing the serial data stream that corresponds to the selected four clock phases to determine whether a new four clock phases should be selected from the plurality of clock phases; and selecting the new four clock phases when the analyzing indicates that the selected four clock phases and the serial data stream are not synchronized, the new four clock phases are selected to prevent the selected four clock phases from leading or lagging the serial data stream.

wherein the serial data stream is continually analyzed for each of the every two bits of the serial data stream and the new four clock phases are only selected when the analyzing indicates that the selected four clock phases and the serial data stream are not synchronized.

2. A method for implementing a data/clock recovery system in a network device receiver as recited in claim 1, wherein the data/clock recovery system is a CMOS implementation that is in communication with a CMOS media access control system.

3. A method for implementing a data/clock recovery system in a network device receiver as recited in claim 2, wherein the CMOS data/clock recovery system and the CMOS media access control system are integrated on one semiconductor chip.

4. A method for implementing a data/clock recovery system in a network device receiver as recited in claim 1, wherein the selected four clock phases and the new four clock phases each have an inter-phase separation that is defined by a separation of $3/8$ bit-time between a first clock phase and a second clock phase, a separation of $1/4$ bit-time between the second clock phase and a third clock phase, and a separation of $3/8$ bit-time between the third clock phase and a fourth clock phase.

5. A data/clock recovery system in a network device receiver the network device receiver being configured to receive a serial data stream, comprising:

a clock generator for producing a plurality of clock phases for every two bits of the serial data stream;

a multiplexer for selecting four clock phases from the plurality of clock phases, the four clock phases having a predetermined separation; and an analyzer for analyzing the serial data stream that corresponds to the selected four clock phases to determine whether a new four clock phases should be selected from the plurality of clock phases and for selecting the new four clock phases when the analyzing indicates that the selected four clock phases and the serial data stream are not synchronized, the new four clock phases are selected to prevent the selected four clock phases from leading or lagging the serial data stream, wherein the serial data stream is continually analyzed for each of the every two bits of the serial data stream and the new four clock phases are only selected when the analyzing indicates that the selected four clock phases and the serial data stream are not synchronized.

6. A data/clock recovery system as recited in claim 5, wherein the data/clock recovery system is a CMOS implementation that is in communication with a CMOS media access control system.

7. A data/clock recovery system as recited in claim 6, wherein the CMOS data/clock recovery system and the CMOS media access control system are integrated on one semiconductor chip.

8. A data/clock recovery system as recited in claim 5, wherein the selected four clock phases and the new four clock phases each have an inter-phase separation that is defined by a separation of $3/8$ bit-time between a first clock phase and a second clock phase, a separation of $1/4$ bit-time between the second clock phase and a third clock phase, and a separation of $3/8$ bit-time between the third clock phase and a fourth clock phase.

* * * * *